United States Patent
Abe et al.

(10) Patent No.: US 10,193,032 B2
(45) Date of Patent: Jan. 29, 2019

(54) METHOD FOR MANUFACTURING LIGHT EMITTING DEVICE

(71) Applicant: NICHIA CORPORATION, Anan-shi, Tokushima (JP)

(72) Inventors: Shogo Abe, Tokushima (JP); Tadayuki Kitajima, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 12 days.

(21) Appl. No.: 15/697,953

(22) Filed: Sep. 7, 2017

(65) Prior Publication Data
US 2018/0097155 A1 Apr. 5, 2018

(30) Foreign Application Priority Data
Sep. 30, 2016 (JP) .................................. 2016-192769

(51) Int. Cl.
| | |
|---|---|
| *H01L 33/00* | (2010.01) |
| *H01L 33/54* | (2010.01) |
| *H01L 33/20* | (2010.01) |
| *H01L 33/58* | (2010.01) |
| *H01L 33/48* | (2010.01) |
| H01L 33/60 | (2010.01) |

(52) U.S. Cl.
CPC .............. *H01L 33/54* (2013.01); *H01L 33/20* (2013.01); *H01L 33/486* (2013.01); *H01L 33/58* (2013.01); *H01L 33/60* (2013.01)

(58) Field of Classification Search
CPC ....................................................... H01L 33/54
See application file for complete search history.

(56) References Cited

U.S. PATENT DOCUMENTS

| | | | |
|---|---|---|---|
| 2013/0033169 A1* | 2/2013 | Ito ......................... | H01L 33/505 313/502 |
| 2014/0203305 A1* | 7/2014 | Kawano ................ | H01L 33/486 257/88 |

FOREIGN PATENT DOCUMENTS

| | | |
|---|---|---|
| JP | 2008-041290 A | 2/2008 |
| JP | 2014-138185 A | 7/2014 |
| JP | 2014-229759 A | 12/2014 |
| JP | 2016-115897 A | 6/2016 |
| WO | 2009-133870 A1 | 11/2009 |
| WO | 2014-007240 A1 | 1/2014 |

* cited by examiner

*Primary Examiner* — William Harriston
(74) *Attorney, Agent, or Firm* — Global IP Counselors, LLP

(57) ABSTRACT

A method for manufacturing a light emitting device includes: providing a substrate including a placement region for placing a light emitting element on a top surface; mounting the light emitting element in the placement region; and forming a frame body surrounding the placement region on the substrate. The step of forming the frame body is performed by arranging a first frame body and second frame body on the substrate to surround the placement region. The second frame body have a larger diameter than the first frame body, and have the same thickness as the first frame body.

12 Claims, 7 Drawing Sheets

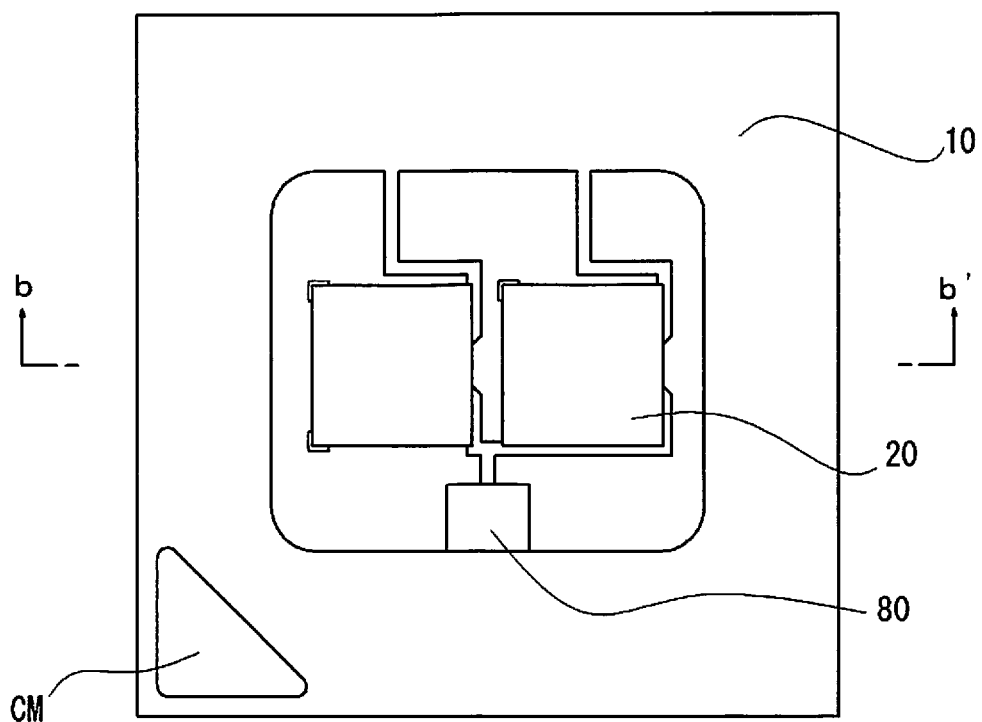
F I G. 2A
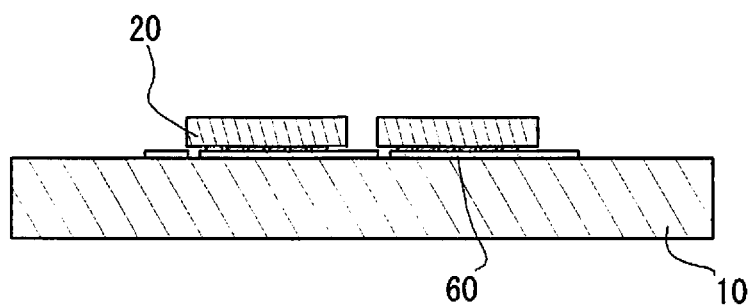
F I G. 2B

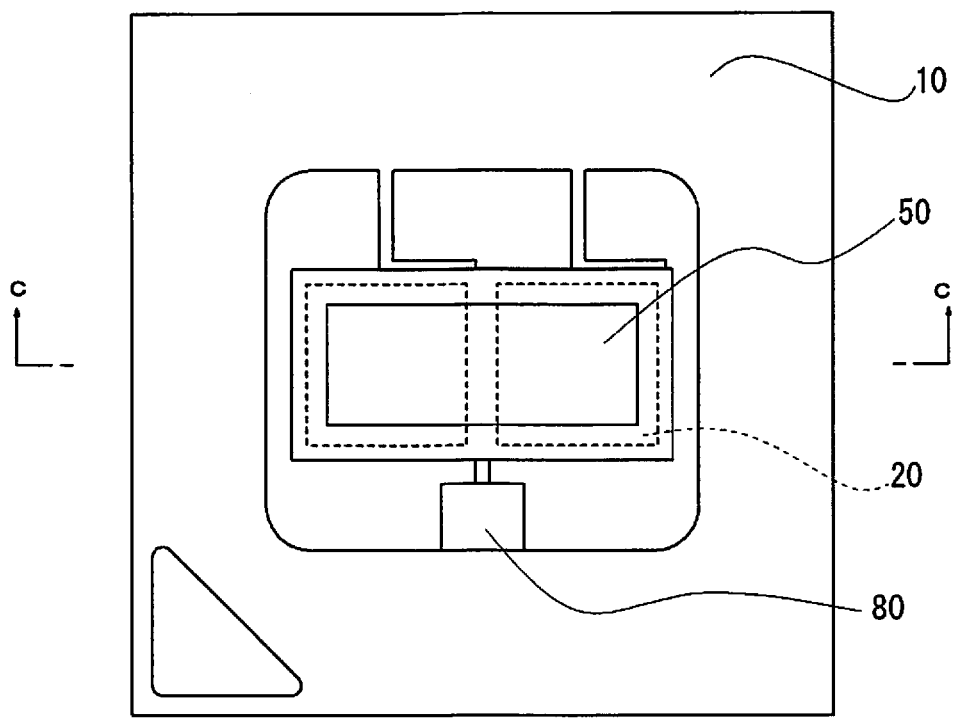
F I G. 3A
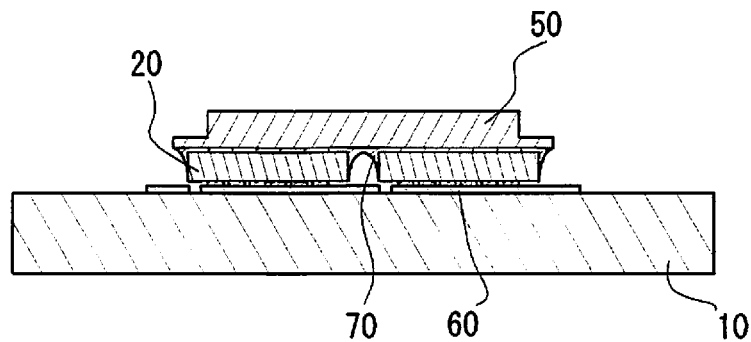
F I G. 3B

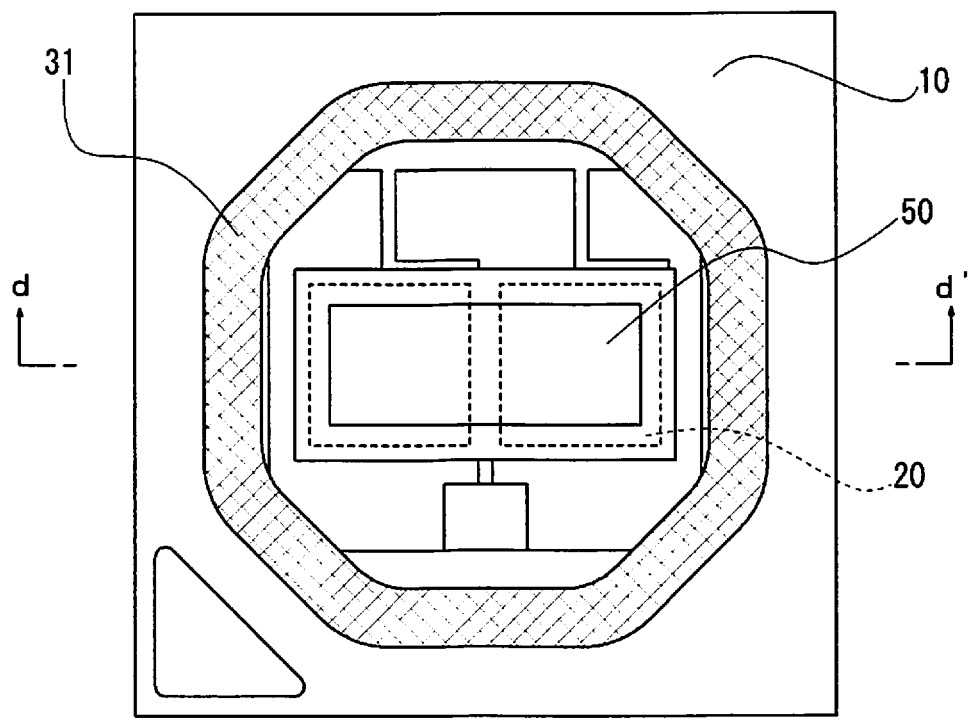
F I G. 4A
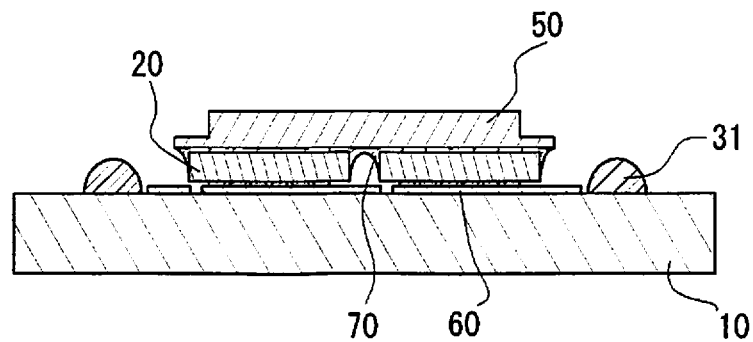
F I G. 4B

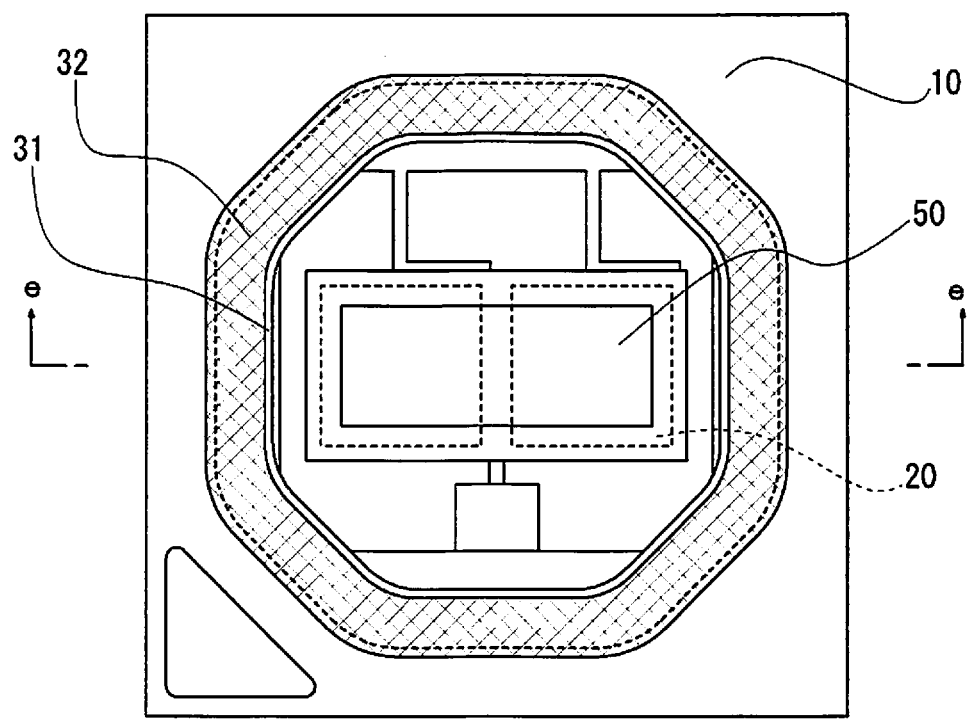
F I G. 5A
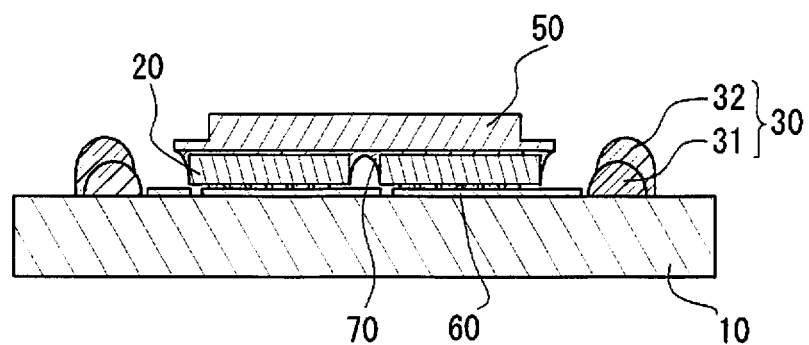
F I G. 5B

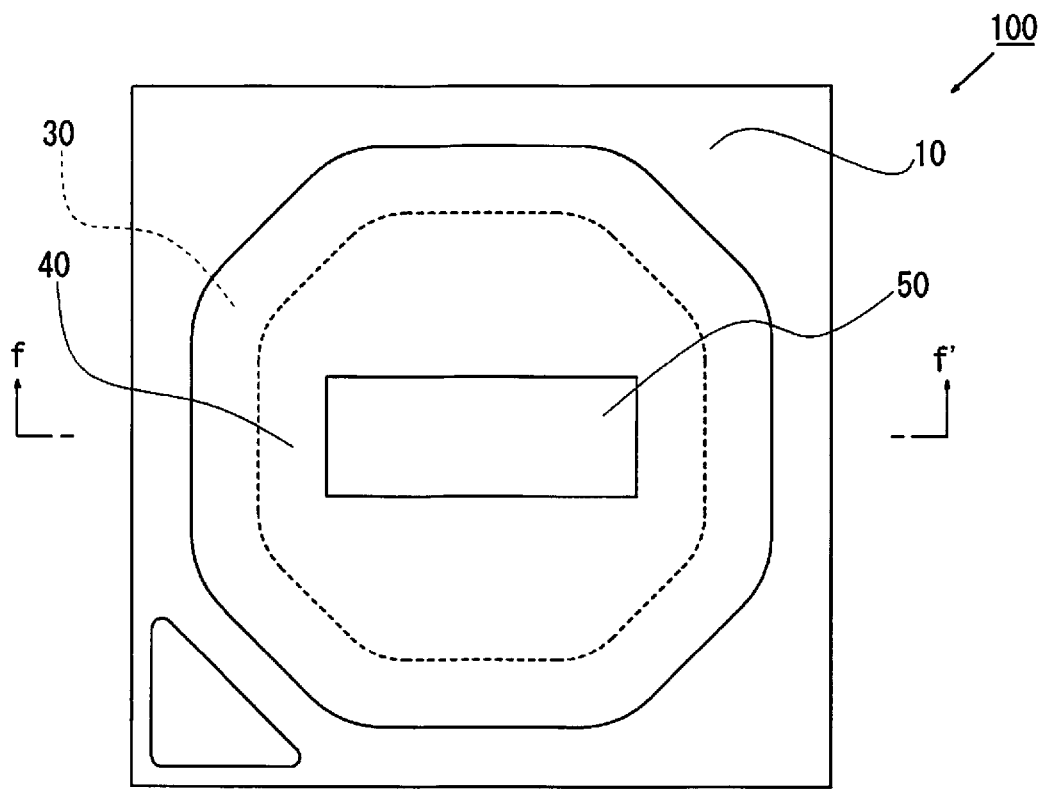
F I G. 6A
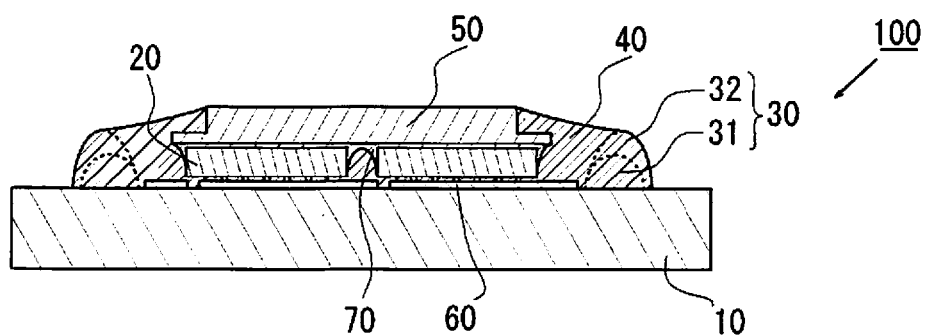
F I G. 6B

METHOD FOR MANUFACTURING LIGHT EMITTING DEVICE

CROSS REFERENCE TO RELATED APPLICATIONS

This application claims priority to Japanese Patent Application No. 2016-192769 filed on Sep. 30, 2016. The entire disclosure of Japanese Patent Application No. 2016-192769 is hereby incorporated herein by reference.

TECHNICAL FIELD

The present disclosure relates to a method for manufacturing a light emitting device.

BACKGROUND ART

A light emitting device is known for which a frame body enclosing light emitting elements is provided on a substrate. Japanese Laid-Open Patent Publication No. 2008-041290 and Japanese Laid-Open Patent Publication No. 2016-115897 disclose conventional light emitting devices.

SUMMARY

For this kind of light emitting device as well, there is demand for the light emitting device to be smaller. However, when forming the frame body using a resin member, there is concern that if the frame body width is made narrow, the frame body will be weak and the frame body will fall over.

The purpose of embodiments of the present disclosure is to provide a method for manufacturing a light emitting device, provided with a frame body enclosing light emitting elements on a substrate, that can be made smaller.

A method for manufacturing a light emitting device includes: providing a substrate including a placement region for placing a light emitting element on a top surface; mounting the light emitting element in the placement region; and forming a frame body surrounding the placement region on the substrate. The step of forming the frame body is performed by arranging a first frame body and second frame body on the substrate to surround the placement region. The second frame body have a larger diameter than the first frame body, and have the same thickness as the first frame body.

With the light emitting device of the embodiments of the present disclosure, it is possible to make the light emitting device, provided with a frame body enclosing light emitting elements on a substrate, smaller.

BRIEF DESCRIPTION OF THE DRAWINGS

FIG. 2A is a schematic top view for explaining a method for manufacturing a light emitting device of one embodiment.

FIG. 2B is a schematic cross-sectional view of line b-b' in FIG. 2A.

FIG. 3A is a schematic top view for explaining a method for manufacturing a light emitting device of one embodiment.

FIG. 3B is a schematic cross-sectional view of line c-c' in FIG. 3A.

FIG. 4A is a schematic top view for explaining a method for manufacturing a light emitting device of one embodiment.

FIG. 4B is a schematic cross-sectional view of line d-d' in FIG. 4A.

FIG. 5A is a schematic top view for explaining a method for manufacturing a light emitting device of one embodiment.

FIG. 5B is a schematic cross-sectional view of line e-e' in FIG. 5A.

FIG. 6A is a schematic top view for explaining a method for manufacturing a light emitting device of one embodiment.

FIG. 6B is a schematic cross-sectional view of line f-f' in FIG. 6A.

DETAIL DESCRIPTION OF EMBODIMENTS

Figure 1A:
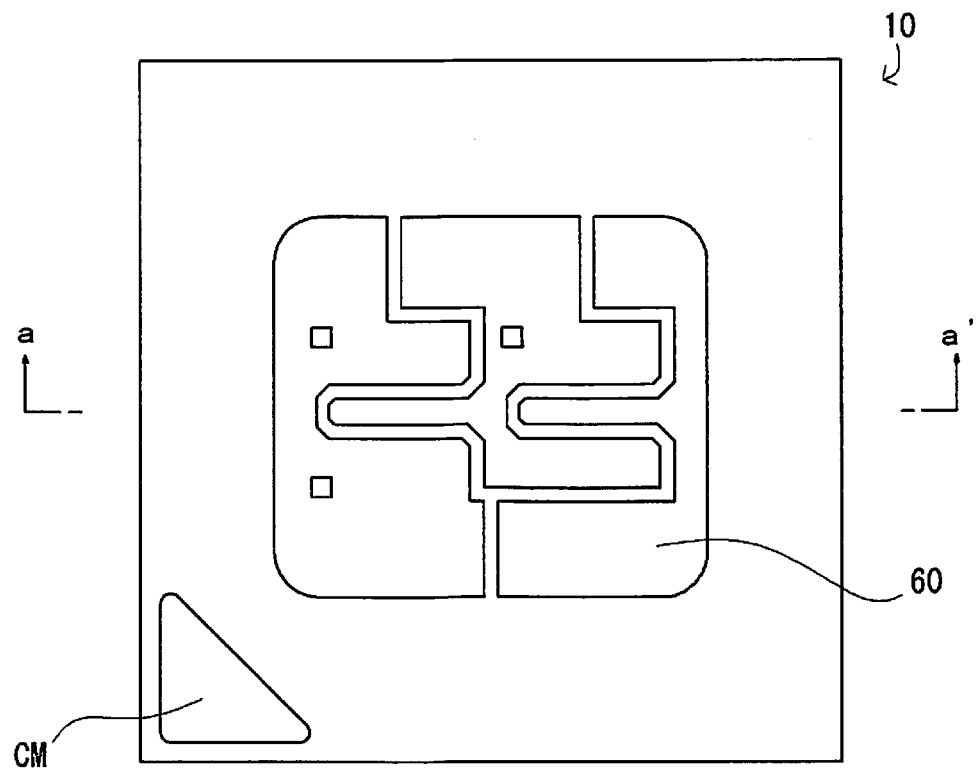
FIG. 1A is a schematic top view for explaining a method for manufacturing a light emitting device of one embodiment.

Following, the manufacturing method of embodiments will be described while referring to the drawings.

However, the modes shown hereafter show examples of the method for manufacturing a light emitting device to put the technical concepts of the present invention into concrete form, and the method for manufacturing a light emitting device of the present invention is not limited to the following description.

Note that the size and positional relationship, etc. of the members shown in each drawing may be exaggerated to clarify a description.

As shown in from FIG. 1A to FIG. 6B, the method for manufacturing a light emitting device of one embodiment of the present disclosure has a step for providing a substrate 10 having a placement region for placing light emitting elements 20 on the top surface, a step for mounting the light emitting elements 20 in the placement region on the substrate 10, and a step for forming a frame body 30 surrounding the placement region on the substrate 10. The step for forming the frame body 30 includes a step of arranging on the substrate 10 a first frame body 31 surrounding the placement region; and a step for arranging on the first frame body 31 a second frame body 32 having a larger diameter than that of the first frame body 31, and having the same thickness as the first frame body 31.

As shown in FIG. 6A and FIG. 6B, a light emitting device 100 manufactured using the manufacturing method of the present embodiment is provided with a flat plate-shaped substrate 10 which has an approximately rectangular shape in the plan view; two light emitting elements 20 for which the plan view shape is an approximately rectangular shape, mounted on the top surface of the substrate 10; one phosphor plate 50 for which the plan view shape is approximately a rectangular shape, provided on the top surface of the light emitting elements 20; a frame body 30 enclosing the light emitting elements 20, provided on the top surface of the substrate 10; and an encapsulant 40 for covering the side surface of the light emitting elements 20 and the side surface of the phosphor plate 50, arranged inside the frame body 30.

With the present embodiment, a second frame body having a larger diameter than that of the first frame body, and having the same thickness as the first frame body is arranged on the first frame body. By layering frame bodies of the same thickness while having the frame diameter be larger in this way, it is possible to stretch the frame body in the height direction while suppressing the contact area with the substrate. By suppressing the contact area of the frame body with the substrate while ensuring the frame body height, it is possible to make the light emitting device 100 smaller.

Hereafter, each step is described in detail.

Step for Providing the Substrate 10

Figure 1B:
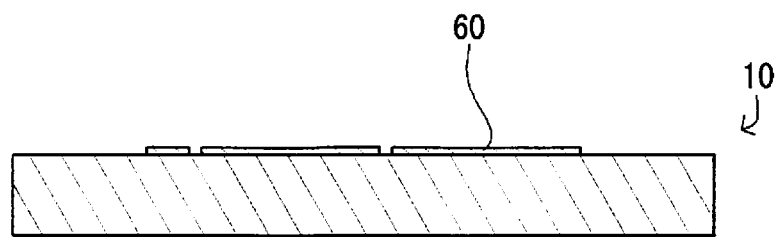
FIG. 1B is a schematic cross-sectional view of line a-a' in FIG. 1A.

A flat plate-shaped substrate 10 is provided as shown in FIG. 1A and FIG. 1B. The substrate 10 is provided with a placement region for placing the light emitting elements 20 on the top surface.

The placement region means a region on which the light emitting elements are mounted using the element placing step described later, and in the substrate 10 state, there is no clear boundary.

The substrate 10 is configured using an insulating material such as glass epoxy resin, polyimide resin, ceramic, or glass, etc. When using ceramic, to increase the thermal resistance of the substrate 10, it is preferable to use alumina, aluminum nitride, mullite, silicon carbide, or silicon nitride, etc. The substrate 10 has an approximately square flat plate shape in the plan view, for example.

The substrate 10 is provided with at least a pair of conductor wires 60 on the top surface for placement of the light emitting elements 20 described later.

Specifically, the substrate 10 is provided with the conductor wires 60 on at least a portion of the placement region on which the light emitting elements are placed. Various sizes and shapes can be selected for the conductor wires. As the conductor wire material, examples include metals such as copper, aluminum, gold, silver, tin, platinum, titanium, tungsten, palladium, iron, or nickel, etc. or alloys containing these, etc. When using a gold bump for mounting of the light emitting element 20, by using gold for the outermost surface of the conductor wire, the bondability of the bump and the conductor wire is improved. It is sufficient to have the conductor wires be arranged on at least the top surface of the substrate, but it is also possible to arrange them on the back surface of the substrate via a hole inside the substrate or the like. Furthermore, the substrate 10 is provided on the substrate top surface with a cathode mark CM indicating the polarity of the light emitting device.

Step for Mounting the Light Emitting Elements

As shown in FIG. 2A and FIG. 2B, the light emitting elements 20 are mounted in the placement region of the substrate 10.

In specific terms, the light emitting elements 20 are mounted on the conductor wires 60 formed on the top surface of the substrate 10. There may also be one light emitting element 20 for one light emitting device; a plurality does not have to be included. In the present embodiment, two light emitting elements are mounted on the substrate 10.

The step of mounting the light emitting elements can be performed after the step of forming the frame body described later, but is preferably performed before the step of forming the frame body. By forming the frame body 30 enclosing the light emitting elements 20 after mounting the light emitting elements 20 on the flat plate-shaped substrate 10, compared to when arranging the light emitting elements inside the frame body 30 of the substrate 10 for which the frame body 30 was formed in advance, it is possible to have a closer distance between the light emitting elements 20 and the frame body 30 inner surface. By having the distance between the light emitting elements 20 and the frame body 30 be closer, it is possible to manufacture the light emitting device 100 having a configuration that can be made smaller.

For the light emitting element 20, it is possible to use a semiconductor light emitting element such as a light emitting diode, etc.

For the light emitting element 20, it is possible to appropriately select and use a light emitting element having a light emission wavelength in any range from the ultraviolet region to the infrared region according to the purpose.

It is possible to use as the light emitting element 20, for example, an item for which a laminate structure including a light emitting layer using various types of semiconductor such as a nitride semiconductor (e.g.: InN, AlN, GaN, InGaN, AlGaN, InGaAlN), a group III-V compound semiconductor, a group II-VI compound semiconductor, or the like is formed on a substrate for growth such as a sapphire substrate, or a GaN substrate, etc.

The light emitting elements 20 can be provided with a pair of positive and negative electrodes on the same surface side, or can be provided with the pair of positive and negative electrodes individually on facing surfaces. With the present embodiment, by using a configuration having the pair of positive and negative electrodes on the same surface side, the light emitting elements 20 are flip-chip mounted on the conductor wires 60 of the substrate 10. In this case, the surface facing opposite the surface on which the pair of electrodes is formed becomes the light extraction surface of the light emitting element 20. With flip-chip mounting, the electrodes of the light emitting elements 20 and the conductor wires on the substrate are electrically joined using an electrically conductive paste form joining member such as solder or the like, or a thin film form or bump form joining member, etc. Alternatively, when the light emitting element is mounted face up, the surface side on which the pair of electrodes is formed can also be the main light extraction surface of the light emitting element 20.

Step for Mounting the Protection Element

With the light emitting device 100 of the present embodiment, a protection element 80 can also be mounted on the substrate 10. The protection element 80 is provided with a purpose such as to protect the light emitting element 20 from static discharge. As the protection element 80, it is possible to use a Zener diode, a varistor, a resistor, a capacitor or the like, for example.

When the light emitting device 100 has the protection element 80, mounting of the protection element 80 onto the substrate 10 is preferably performed before forming the frame body 30. Furthermore, for the protection element 80, it is preferable that the protection element 80 be mounted inside the frame body 30 and buried by the encapsulant 40, so as to suppress absorption of light from the light emitting element 20 into the protection element 80.

Step for Arranging the Phosphor Plate

As shown in FIG. 3A and FIG. 3B, with the present embodiment, included is a step of arranging the phosphor plate 50 on the top surface of the light emitting elements 20. For the phosphor plate 50, preferably a phosphor plate for which the top surface has a smaller area than the bottom surface is used. When a plurality of light emitting elements 20 are covered by one phosphor plate 50, the bottom surface of the phosphor plate 50 preferably covers all the respective light extraction surfaces of the plurality of light emitting elements 20. It is thereby possible to cover all of the light radiating surfaces of the light emitting elements 20 with the phosphor plate 50, and thus possible to reduce light loss.

The top surface area of the phosphor plate 50 is preferably smaller than the sum of the top surface areas of the more than one light emitting elements that the light emitting device 100 is provided with. For example, as shown in FIG. 3B, by having the top surface area be smaller than the bottom surface area, the emitted light from the light emitting element 20 incident from the bottom surface of the phosphor plate 50 can be discharged from the top surface (in other words, the light emitting surface of the light emitting device 100) which has a smaller surface area. In other words, with the light emitting device 100, the emitted light from the light emitting elements has a high luminance due to being narrowed by the phosphor plate 50, making it possible to shine at a greater distance.

The phosphor plate 50 is a phosphor-containing plate shaped member covering the light extraction surface of the light emitting element 20, for which wavelength conversion is possible for at least a portion of the light emitted from the light emitting element 20. Examples of the phosphor plate 50 include a phosphor sintered body, or an item with phosphor powder contained in a resin, glass, or other inorganic substance, etc. As the phosphor sintered body, an item formed by sintering only phosphor can be used, or an item formed by sintering a mixture of phosphor and a sintering additive can be used. When sintering a mixture of phosphor and a sintering additive, as the sintering additive, it is preferable to use an inorganic material such as silicon oxide, aluminum oxide, or titanium oxide, etc. Thereby, even if the light emitting element 20 has high output, it is possible to mitigate discoloration or deformation of the sintering additive due to light or heat. With the phosphor plate 50, the higher the light transmittance, the easier it is to reflect light at the boundary surface with the encapsulant 40 described later, which is therefore preferable because it is possible to improve luminance. When the light output from the light emitting element 20 is high, the phosphor plate 50 is preferably configured using only inorganic substances.

As the phosphor contained in the phosphor plate 50, items that can be excited by light emission from the light emitting elements 20 are used. For example, of the specific examples shown hereafter, it is possible to use one type alone, or to combine two or more types. As specific examples of phosphors that can be excited by blue light emitting elements or ultraviolet ray light emitting elements, examples include yttrium-aluminum garnet-based phosphor activated by cerium (e.g. $Y_3(Al, Ga)_5O_{12}$:Ce), lutetium-aluminum-garnet-based phosphor activated by cerium (e.g. $Lu_3(Al, Ga)_5O_{12}$:Ce), nitrogen-containing calcium aluminosilicate-based phosphor activated by europium and/or chromium (e.g. $CaO-Al_2O_3-SiO_2$:Eu), silicate-based phosphor activated by europium (e.g. $Sr, Ba)_2SiO_4$:Eu), β SiAlON-based phosphor (e.g. $Si_{6-Z}Al_ZO_ZN_{8-Z}$:Eu (0<Z<4.2)), a nitride-based phosphor such as CASN-based phosphor (e.g. $CaAlSiN_3$:Eu), SCASN-based phosphor (e.g. $(Sr, Ca)AlSiN_3$:Eu), etc., potassium fluorosilicate-based phosphor activated by manganese (e.g. $K_2SiF_6$:Mn), sulfide-based phosphor, a quantum dot phosphor or the like. By combining these phosphors with blue light emitting elements or ultraviolet light emitting elements, it is possible to manufacture various color light emitting devices (e.g. a white light emitting device). When using a light emitting device that can emit white light, the type and concentration of phosphor contained in the phosphor plate is adjusted so as to be white.

The phosphor plate 50 can contain a light diffusing material, and as the light diffusing material, it is possible to use titanium oxide, barium titanate, aluminum oxide, silicon oxide, or the like, for example.

The light emitting elements 20 and the phosphor plate 50 can be joined using an adhesive material 70. The adhesive material 70 joins the bottom surface of the phosphor plate 50 and the top surface of the light emitting elements 20.

For the adhesive material 70, it is possible to perform adhesion using a known adhesive agent such as epoxy or silicone, or an organic adhesive agent with a high refractive index, or adhesion using a low melting point glass.

The adhesive material 70 is preferably provided on the top surface of the light emitting elements 20 as well as up to the side surface of the light elements 20. By providing the adhesive material 70 from the top surface of the light emitting elements 20 extending to the side surface, it is possible to also have light from the side surface side of the light emitting elements 20 incident on the phosphor plate 50, making it possible to increase the light extraction efficiency of the light emitting device 100.

Joining of the phosphor plate 50 and the light emitting elements 20 can be done by direct joining using a direct junction method such as pressure welding, sintering, a hydroxyl group joining method, a surface activation joining method, an atomic diffusion bonding method or the like.

Step for Forming the Frame Body

As shown in FIG. 4A through FIG. 6B, the frame body 30 is formed on the substrate 10. The frame body 30 is configured using a resin member. In specific terms, as the material for the frame body 30, it is possible to use a silicone resin, a modified silicone resin, an epoxy resin, a modified epoxy resin, an acrylic resin, or a hybrid resin including at least one of these types of resins, etc. It is possible to contain a light reflective member that reflects the light of the light emitting elements 20 in these resin materials.

Examples of the light reflective member include $TiO_2$, $Al_2O_3$, $ZrO_2$, MgO, BN and the like.

Step for Forming the First Frame Body

As shown in FIG. 4A, the first frame body 31 is arranged surrounding the placement region of the light emitting elements 20 on the substrate 10.

The first frame body 31 is formed, for example, by having a needle of a resin discharging device arranged above the substrate 10, and while discharging uncured resin material onto the substrate 10 from the tip of the needle, having the needle move in one circle around the circumference of the placement region. The uncured resin material discharged from the needle is wet-spread on the substrate 10, and as shown in FIG. 4B, is arranged on the substrate 10 as a first frame body 31 with an approximately semicircular cross section view shape. By wet-spreading pre-cured resin material on the substrate, the contact surface area of the resin material and the substrate is increased, improving the adhesion between the first frame body 31 and the substrate 10.

Step for Forming the Second Frame Body

Subsequently, as shown in FIG. 5A and FIG. 5B, the second frame body 32 having a larger frame diameter than the first frame body 31 and the same thickness as the first frame body 31 is arranged on the first frame body 31. The same as the first frame body 31, the second frame body 32 is formed by continuously discharging uncured resin material on the first frame body from the tip of the resin discharging device needle. The second frame body 32 having a larger diameter than the first frame body 31 can be formed, for example, by setting the track of the needle when discharging the resin material for forming the second frame body to move one circle around the circumference of the placement region further to the outside than when forming the first frame body. Also, the second frame body of the same thickness of the first frame body can be formed by suitably setting the size of the inner diameter of the needle or the movement speed of the needle. With the first frame body 31 arranged on the flat substrate 10 and the second frame body 32 arranged on the first frame body with an approximately semicircular shape in the cross section view, after wet-spreading and curing, there are cases when the respective thickness in the plan view differs.

However, with the present embodiment, the second frame body 32 of the same thickness as the first frame body 31 can be arranged as long as they are the same thickness at least at the time of arranging. For example, it is possible to arrange the second frame body of the same thickness as the first frame body on the first frame body by discharging resin material of the same viscosity as the resin material forming the first frame body using a needle with the same inner diameter at the same speed.

The second frame body 32 arranged on the first frame body 31 is preferably cured together with the first frame body 31. In other words, it is preferable that the step of curing the first frame body 31 and the second frame body 32 be done simultaneously. This is preferable because the adhesion of the first frame body 31 and the second frame body 32 is thereby improved, and the manufacturing process is also simplified. The first frame body 31 and the second frame body 32 are cured, thus forming the frame body 30.

As described above, in the manufacturing process for forming the frame body by curing after arranging the uncured resin material on the substrate, by making the viscosity of the discharged resin material higher, for example, the wet-spreading of the resin material is suppressed, making it possible to form the frame body at a higher height. However, when the wet-spreading resin quantity is small, the contact area between the resin material and the substrate becomes smaller, reducing the adhesion between the substrate and frame body. Also, by lowering the viscosity of the discharged resin material, the resin material spreads more easily, and the adhesion between the frame body and the substrate improves, but the height of the frame body becomes lower by the amount that the resin material spread on the substrate. Therefore, it is preferable that the viscosity of the resin material forming the frame body be at a level for which the encompassing circle wet-spreads onto the substrate 10 so that the cross section shape of the frame body is approximately semicircular in shape. The viscosity of the resin material for forming such a frame body is approximately 200 Pa·s to 800 Pa·s, for example.

In other words, when considering the adhesion between the frame body and the substrate, it is preferable that the cross section shape of the frame body on the substrate (e.g. the first frame body 31) be approximately a semicircular shape. Here, an approximately semicircular shape includes an item with a ratio of approximately 1:0.4-0.6 for the frame body width (in other words, the bottom side length of the approximately semicircular shape in the cross section view) and the height (in other words, the distance from the top surface of the substrate to the apex of the frame body). Said another way, it can be said that the width needs to be 1.7 times or greater than the height of the frame body, and preferably approximately 2 times or greater.

When a plurality of frame bodies are sequentially laminated to make the height of the frame body higher, the balance of the frame bodies becomes harder to maintain with each frame body lamination, causing susceptibility to be falling. In particular, when the plan view shape of the frame bodies is a circle or a polygon of a hexagon or above (a polygon having six or more sides) that is almost circular, the frame bodies tend to be susceptible to falling inward.

In light of that, with the present embodiment, the second frame body 32 of the same thickness as the first frame body 31 has the frame diameter (in other words, the diameter of the frame) made greater than that of the first frame body 31 as it is laminated on the first frame body 31. In other words, the center of gravity of the second frame body 32 in the cross section view is directly above the first frame body 31, and the second frame body 32 is arranged so as to be positioned further outward than the center of gravity of the first frame body 31. In this way, by skewing the center of gravity position of the laminated second frame bodies 32 outward in the cross section view, it is possible to suppress falling to the inside of the frame body 30, and it is possible to make the frame body 30 higher while suppressing the contact surface area between the frame body 30 and the substrate 10.

The frame body 30 laminated in this way can be realized by setting the track of the needle discharging the resin material for forming the second frame body 32 to be drawn slightly further to the outside than the track when forming the first frame body 31. The needle track at this time is preferably set so as to be drawn further to the outside by a shorter distance than the thickness of the first frame body 31 arranged on the substrate 10 (the difference between the outer diameter and the inner diameter of the first frame body 31 after wet-spreading on the substrate). It is thereby possible to keep the contact surface area between the substrate 10 and the second frame body 32 small, and possible to make the frame body 30 smaller.

It is preferable that a portion of the second frame body 32 be in contact with the substrate at the outside of the first frame body 31. By having a portion of the second frame body 32 be in contact with the substrate 10 at the outside of the first frame body 31, it is possible to mitigate falling to the inside of the frame body 30.

For example, of the frame body 30, the proportion of the second frame body 32 that contacts the substrate 10 can be approximately ¼₀ to ⅐ the length of the bottom side of the frame body 30 in the cross section view.

By forming the first frame body 31 and the second frame body 32 laminated in this way, while suppressing the contact surface area of the frame body 30 with the substrate 10, it is possible to form the frame body 30 to be higher (e.g. higher than the top surface of the light emitting elements 20). The ratio of the width (in other words, the length of the bottom side of the frame body in the cross section view) and height (in other words, the distance from the substrate top surface to the apex of the frame body) of the frame body 30 formed in this way is approximately 1:0.6-1.0, for example.

Figure 7:
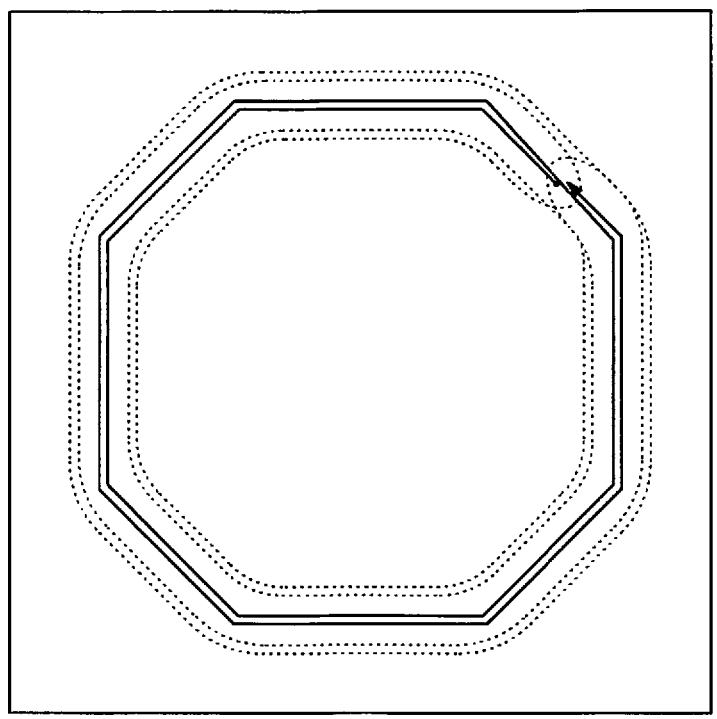
FIG. 7 is a schematic plan view showing the track of a needle of a resin discharging device in the method for manufacturing a light emitting device of one embodiment.

It is preferable that the step of forming the first frame body 31 and the step of forming the second frame body 32 be performed successively, and for example, as shown by the arrow in FIG. 7, after forming the first frame body 31, it is possible to do formation by moving the needle for discharging the resin material from the end point of the first frame body 31 to the start point of the second frame body 32 while discharging the resin material. Using resin material of the same viscosity as that of the first frame body for the second frame body, it is thereby possible to continuously discharge from a needle of the same inner diameter, making it possible to simplify the manufacturing process.

Also, to form a taller frame body, it is possible to further laminate a third frame body on the second frame body 32. The third frame body, the same as the second frame body arranged on the first frame body, has a larger frame diameter than the second frame body, and is arranged with the same thickness as the second frame body. By further forming the third frame body on the second frame body, it is possible to form a taller height frame body 30. At that time, it is preferable that a portion of the third frame body be in contact with the substrate 10 at the outside of the second frame body.

It is not absolutely necessary to have the same viscosity for the viscosity of the resin material for forming the first frame body and the resin material for forming the second frame body, and for example, by using a resin material with a higher viscosity for the resin material for forming the second frame body than the resin material for forming the first frame body, it is possible to suppress wet-spreading of the second frame body on the first frame body, and to form the frame body 30 to be taller than when laminating the second frame body of the same viscosity.

Step for Arranging the Encapsulant within the Frame Body

Subsequently, as shown in FIG. 6A and FIG. 6B, the encapsulant 40 is arranged in a region surrounded by the frame body 30. With the present embodiment, the phosphor plate 50 is arranged on the top surface of the light emitting elements 20, so the encapsulant 40 exposes the top surface of the phosphor plate 50, and covers the side surfaces of the light emitting elements 20 and the phosphor plate 50. The encapsulant 40 can be arranged by dropping resin material for forming the encapsulant 40 between the phosphor plate 50 on the substrate 10 and the frame body 30, for example.

The encapsulant 40 is a member for encapsulating the region surrounded by the frame body 30 to protect the light emitting elements 20 from dust, moisture, gas, external force, etc. As the material for the encapsulant 40, it is preferable to use a member having light resistance to the light of the light emitting elements 20, and in specific terms, it is preferable to use silicone resin, epoxy resin, urea resin, or the like.

In the encapsulant 40, it is possible to contain a filler such as a light reflection member, etc. according to the purpose. As the light reflection member, for example, it is possible to suitably use a material with high light reflectivity such as $TiO_2$, $Al_2O_3$, $ZrO_2$, MgO, BN or the like.

As with the light emitting device 100 of the present embodiment, when the light emitting device 100 is provided with phosphor for covering the light emitting elements, it is preferable that the height of the frame body 30, as shown in FIG. 6B, be higher than the top surface of the light emitting elements 20 mounted on the substrate, and lower than the top surface of the phosphor plate 50. By the frame body 30 having this kind of height, even if the distance between the light emitting elements 20 and the inside surface of the frame body 30 is made closer, it is possible to arrange the encapsulant inside the frame body without the encapsulant covering the top surface of the phosphor plate. It is thereby possible to manufacture the light emitting device 100 having a structure that can be made smaller.

Above, using modes for carrying out the invention, a specific explanation was given for the light emitting device and the manufacturing method thereof of the present invention, but the gist of the present invention is not limited to those descriptions, and must be interpreted broadly based on the description of the claims. It is also clear that various modifications, revisions and the like based on these descriptions are included in the gist of the present invention.

The light emitting device of the embodiments of the present disclosure can be used for various types of light equipment such as lighting for a vehicle such as headlights, etc., LED light bulbs, spotlights, or the like, for various types of display devices such as the backlight light source of a liquid crystal display, large displays, advertisements, destination guides or the like, and also for various types of light sources such as for digital video cameras, image reading devices such as for fax machines, copy machines, scanners, etc., and projector devices, etc.

What is claimed is:

1. A method for manufacturing a light emitting device comprising:
   providing a substrate including a placement region for placing a light emitting element on a top surface;
   mounting the light emitting element in the placement region; and
   forming a frame body surrounding the placement region on the substrate by
      arranging a first frame body by discharging a resin material on the substrate to surround the placement region, and
      successively arranging a second frame body having a larger diameter than the first frame body on the first frame body and having the same thickness as the first frame body by continuously discharging the resin material from the arranging of the first frame body.

2. The method for manufacturing a light emitting device according to claim 1, wherein
   the arranging of the second frame body includes arranging the second frame body such that a portion of the second frame body is in contact the substrate.

3. The method for manufacturing a light emitting device according to claim 1, wherein
   the forming of the frame body includes forming the frame body such that a plan view shape of the frame body is a polygon having six or more sides, or a circle.

4. The method for manufacturing a light emitting device according to claim 1, wherein
   the viscosity of the resin material is 200 Pa·s to 800 Pa·s.

5. The method for manufacturing a light emitting device according to claim 1, wherein
   the resin material contains a light reflective member.

6. The method for manufacturing a light emitting device according to claim 1, further comprising
   arranging a phosphor plate on a top surface of the light emitting element before the forming of the frame body.

7. The method for manufacturing a light emitting device according to claim 6, wherein
   a height of the frame body is higher than the top surface of the light emitting element, and lower than a top surface of the phosphor plate.

8. A method for manufacturing a light emitting device comprising:
   providing a substrate including a placement region for placing a light emitting element on a top surface;
   mounting the light emitting element in the placement region;
   arranging a phosphor plate on a top surface of the light emitting element; and
   forming a frame body surrounding the placement region on the substrate by arranging a first frame body on the substrate to surround the placement region, and arranging a second frame body having a larger diameter than the first frame body on the first frame body, and having the same thickness as the first frame body, wherein a top surface of the phosphor plate has a smaller surface area than a bottom surface of the phosphor plate.

9. The method for manufacturing a light emitting device of claim 1, further comprising arranging an encapsulant in a region surrounded by the frame body.

10. The method for manufacturing a light emitting device according to claim 9, wherein the encapsulant includes a resin material.

11. The method for manufacturing a light emitting device according to claim 9, wherein the encapsulant contains a filler.

12. The method for manufacturing a light emitting device of claim 6, further comprising arranging an encapsulant in a region surrounded by the frame body.

* * * * *